United States Patent
Bahk

(10) Patent No.: US 9,423,306 B2
(45) Date of Patent: Aug. 23, 2016

(54) METHOD AND APPARATUS FOR WAVEFRONT SENSING

(71) Applicant: RAM Photonics, LLC, San Diego, CA (US)

(72) Inventor: Seung-Whan Bahk, Rochester, NY (US)

(73) Assignee: RAM PHOTONICS, LLC, San Diego, CA (US)

( * ) Notice: Subject to any disclaimer, the term of this patent is extended or adjusted under 35 U.S.C. 154(b) by 0 days.

(21) Appl. No.: 14/587,392

(22) Filed: Dec. 31, 2014

(65) Prior Publication Data

US 2015/0300885 A1  Oct. 22, 2015

Related U.S. Application Data

(60) Provisional application No. 61/923,362, filed on Jan. 3, 2014.

(51) Int. Cl.
  *G01B 9/02* (2006.01)
  *G01J 9/02* (2006.01)
  *G03F 7/20* (2006.01)

(52) U.S. Cl.
  CPC ... *G01J 9/02* (2013.01); *G01B 9/02* (2013.01); *G03F 7/706* (2013.01)

(58) Field of Classification Search
  CPC ............ G01B 9/02; G01J 9/02; G01J 9/0215; G03F 7/706; G01M 11/0271
  USPC ........................................................ 356/521
  See application file for complete search history.

(56) References Cited

U.S. PATENT DOCUMENTS

| | | | | |
|---|---|---|---|---|
| 3,572,878 A * | 3/1971 | Lu | .............................. | G02B 5/32 359/559 |
| 3,993,976 A * | 11/1976 | Ginsburg | ................ | G06K 9/748 250/550 |
| 6,025,911 A * | 2/2000 | Diddams | .................. | G01J 11/00 356/450 |
| 6,633,386 B2 * | 10/2003 | Walmsley | ................ | G01J 11/00 356/450 |
| 6,882,432 B2 * | 4/2005 | Deck | ....................... | G01B 11/06 356/512 |
| 7,440,115 B2 | 10/2008 | Horwitz | | |
| 7,826,066 B2 | 11/2010 | Primot et al. | | |

(Continued)

OTHER PUBLICATIONS

Bahk, S.-W., et al., "Generation and characterization of the highest laser intensities ($10^{22}$ W/cm$^2$)," *Optics Letters* vol. 29, No. 24, (Dec. 2004): pp. 2837-2839.

(Continued)

*Primary Examiner* — Tarifur Chowdhury
*Assistant Examiner* — Md M Rahman
(74) *Attorney, Agent, or Firm* — Kilpatrick, Townsend & Stockton, LLP

(57) ABSTRACT

A method of measuring characteristics of a wavefront of an incident beam includes obtaining an interferogram associated with the incident beam passing through a transmission mask and Fourier transforming the interferogram to provide a frequency domain interferogram. The method also includes selecting a subset of harmonics from the frequency domain interferogram, individually inverse Fourier transforming each of the subset of harmonics to provide a set of spatial domain harmonics, and extracting a phase profile from each of the set of spatial domain harmonics. The method further includes removing phase discontinuities in the phase profile, rotating the phase profile, and reconstructing a phase front of the wavefront of the incident beam.

10 Claims, 6 Drawing Sheets

(56) References Cited

U.S. PATENT DOCUMENTS

| | | | | |
|---|---|---|---|---|
| 8,937,722 | B2* | 1/2015 | Cotte | G02B 21/365 356/457 |
| 2003/0025911 | A1* | 2/2003 | Walmsley | G01J 11/00 356/450 |
| 2012/0116703 | A1* | 5/2012 | Pavillon | G03H 1/0866 702/70 |
| 2013/0057869 | A1* | 3/2013 | Cotte | G02B 21/365 356/457 |
| 2001/0109851 | * | 7/2014 | Day | G01J 3/443 356/318 |

OTHER PUBLICATIONS

Bahk, S.-W., "Band-limited wavefront reconstruction with unity frequency response from Shack-Hartmann slopes measurements," *Optics Letters* vol. 33, No. 12 (Jun. 2008): pp. 1321-1323.

Bahk, S.-W., et al., "A high-resolution, adaptive beam-shaping system for high-power lasers," *Optics Express* vol. 18, No. 9 (Apr. 2010): pp. 9151-9163.

Bahk, S.-W., "Highly accurate wavefront reconstruction algorithms over broad spatial-frequency bandwidth," *Optics Express* vol. 19, No. 20 (Sep. 2011):pp. 18997-19014.

* cited by examiner (a)

$$\frac{\partial \phi}{\partial x}$$

$$\frac{\partial \phi}{\partial y}$$

METHOD AND APPARATUS FOR WAVEFRONT SENSING

CROSS-REFERENCES TO RELATED APPLICATIONS

This application claims priority to U.S. Provisional Patent Application No. 61/923,362, filed on Jan. 3, 2014, entitled "Apparatus and Method for Wavefront Sensing," the disclosure of which is hereby incorporated by reference in its entirety for all purposes.

STATEMENT AS TO RIGHTS TO INVENTIONS MADE UNDER FEDERALLY SPONSORED RESEARCH AND DEVELOPMENT

This invention was made with Government support under Contract No. DE-FC52-08NA28302 awarded by the United States Department of Energy. The Government has certain rights in the invention.

BACKGROUND OF THE INVENTION

Numerous techniques have been used for wavefront sensing. Generally, wavefront sensors are used to measure aberrations in an optical wavefront.

Although various techniques have been used to implement wavefront sensors that measure the characteristics of wavefronts, there is a need in the art for improved methods and systems related to wavefront sensing.

SUMMARY OF THE INVENTION

Embodiments of the invention generally relate to the field of optical wavefront sensing. More particularly, the methods and apparatus described herein relate to enhanced wavefront characterization using, for example, a checkerboard amplitude mask based on the principle of lateral shearing interferometry (LSI). In a particular embodiment, methods and apparatus are provided that overcome the spatial resolution limit associated with conventional wavefront sensing techniques, for example, lateral shearing interferometry (LSI).

According to an embodiment of the present invention, a method of measuring characteristics of a wavefront of an incident beam is provided. The method includes obtaining an interferogram associated with the incident beam passing through a transmission mask and Fourier transforming the interferogram to provide a frequency domain interferogram. The method also includes selecting a subset of harmonics from the frequency domain interferogram, individually inverse Fourier transforming each of the subset of harmonics to provide a set of spatial domain harmonics, and extracting a phase profile from each of the set of spatial domain harmonics. The method further includes removing phase discontinuities in the phase profile, rotating the phase profile, and reconstructing a phase front of the wavefront of the incident beam.

According to another embodiment of the present invention, a method for performing optical wavefront sensing. The method includes providing an amplitude transmission mask having a light input side, a light output side, and an optical transmission axis passing from the light input side to the light output side. The amplitude transmission mask is characterized by a checkerboard pattern having a square unit cell of size Λ. The method also includes directing an incident light field having a wavelength λ to be incident on the light input side and propagating the incident light field through the amplitude transmission mask. The method further includes producing a plurality of diffracted light fields on the light output side and detecting, at a detector disposed a distance L from the amplitude transmission mask, an interferogram associated with the plurality of diffracted light fields. The distance satisfies $$0 < L < \frac{1}{8}\frac{\Lambda^2}{\lambda} \text{ or } \frac{1}{4}\frac{\Lambda^2}{\lambda}(2n-1) < L < \frac{1}{4}\frac{\Lambda^2}{\lambda}(2n+1),$$

where n is an integer greater than zero.

According to a specific embodiment of the present invention, a wavefront sensor is provided. The wavefront sensor includes an amplitude-only transmission mask characterized by a checkerboard pattern having a unit square cell of size Λ and a detector disposed at a distance, L, optically downstream of the amplitude-only transmission mask. The distance satisfies $$0 < L < \frac{1}{8}\frac{\Lambda^2}{\lambda} \text{ or } \frac{1}{4}\frac{\Lambda^2}{\lambda}(2n-1) < L < \frac{1}{4}\frac{\Lambda^2}{\lambda}(2n+1),$$

where λ is the wavelength of the incident field and n is a positive integer. The wavefront sensor also includes a computer coupled to the detector.

According to an embodiment of the present invention, a compact wavefront measurement system and data analysis method is provided. The wavefront sensor includes a checkerboard amplitude-only transmission mask disposed a predetermined distance in front of a detector. An incident wavefront, which is defined by a phase front and an intensity profile, is diffracted through the checkerboard mask. An image of self-interference between the replicated diffracted beams is detected. The frequency domain analysis of the diffraction pattern created by the checkerboard mask enables the extraction of a high resolution wavefront map in the incident field. This extraction process involves a Fourier domain structure of the cross-terms between the diagonal and zero-order diffraction fields belonging to the checkerboard mask.

Numerous benefits are achieved by way of the present invention over conventional techniques. For example, embodiments of the present invention provide methods and systems that provide physically and mathematically simpler apparatus in comparison to conventional systems. Moreover, embodiments of the present invention provide improvements in measurement results, for example, higher spatial resolution, easier manufacturability, and size scalability, than conventional systems. These and other embodiments of the invention along with many of its advantages and features are described in more detail in conjunction with the text below and attached figures.

DETAILED DESCRIPTION OF SPECIFIC EMBODIMENTS

Various techniques have been used to perform wavefront sensing. Heterodyne interferometers such as Michelson, Fizeau, or Mach-Zehnder schemes can require separate reference beams and are bulky. Homodyne interferometers based on interference between the original field and its spatially sheared replicas are called lateral shearing interferometers. Hartmann sensors, Ronchi tests, Shack-Hartmann sensors, like lateral shearing interferometers, do not require on-line reference beams. Hartmann sensors use a two-dimensional array of holes whose dimensions are well known. The projection of the image of the holes on a detector further away carries the spatial derivative information from which the wavefront can be reconstructed. Shack-Hartmann sensors improve the low signal-to-noise ratio in the Hartmann sensor by using an array of microlens instead of holes. The deviation of the centroid of each focal spot from the micro-lens, as in Hartmann sensors, contains spatial slopes information that can be integrated to reconstruct a wavefront map.

Shack-Hartmann wavefront sensors are used in diverse fields, including astronomy, eye diagnostics, and laser beam correction. However, these wavefront sensors have the disadvantage of not being able to measure relative piston terms coming from segmented optics. Incoherent background noise is another problem with this type of sensor since background room light distorts the centroiding of each microlenslet cell.

Figure 3A:
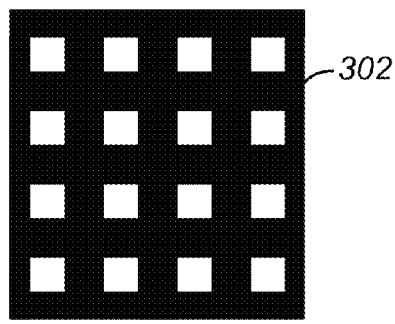
FIG. 3A is diagram illustrating a Hartmann mask.

An alternative to this type of wavefront sensing is to use the technique of lateral shearing interferometry (LSI), which is not affected by incoherent background light and can be used to detect relative piston terms. One version of a lateral shearing interferometer uses a special two-dimensional amplitude-phase grating (such as a Hartmann or Shack-Hartmann mask as illustrated in FIG. 3A) and is based on multi-wave self-interference coming from the grating. This approach requires using both a phase and amplitude grating, which is relatively expensive to manufacture and not easily scalable to a larger size.

Figure 3B:
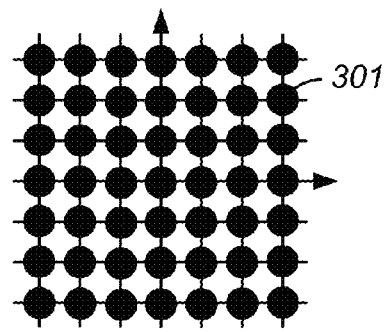
FIG. 3B is a frequency domain plot of the intensity associated with the Hartmann mask illustrated in FIG. 3A.

The transmission function of a periodic mask (grid) where $\Lambda_x$, $\Lambda_y$ are periods in the x and y directions can be written as $$T(x, y) = \sum_{m,n} c_{m,n} \exp\left(i\frac{2\pi}{\Lambda_x}mx + i\frac{2\pi}{\Lambda_x}ny\right), \quad (1)$$

where $c_{m,n}$ are the Fourier coefficients that uniquely represent a particular two dimensional periodic structure such as a grid or the Hartmann mask as illustrated in FIG. 3A. In general, the Fourier coefficients ($c_{m,n}$) are complex numbers. The $c_{m,n}$ of a Hartmann mask, for example, are distributed at all indices of (m,n) as shown in FIG. 3B. Each grid in FIG. 3B is in units of inverse period of the (Shack-) Hartmann cell.

Each term in the summation in Eq. (1) with m≠0 or n≠0 can be referred to as a harmonic or a carrier and the term with m=0 and n=0 as a DC term. As any one-dimensional periodic structure can be represented by the sum of a DC term and harmonics, the two-dimensional periodic structure such as the Hartmann mask can also be represented by the sum of a DC term and two-dimensional harmonics that has two fundamental frequencies in the x- and y-directions, respectively.

Electric-field propagation over a distance L through a grid or mask can be similarly represented as a Fourier series. When the electromagnetic field is detected on a CCD after propagating through a Hartmann mask, for example, its Fourier coefficients are multiplied by propagation factors ($A_{m,n}$) according to the propagation distance L and the wavelength, and the time integrated intensity (not the E field) is detected at the detection plane. The mathematical expression on the detector follows a form of the absolute squared of the above expression with $c_{mn}$ replaced with $c_{mn}A_{mn}$:

$$H(x, y) = \sum_{m,n,m',n'} c_{m,n} c_{m,n}^* A_{m,n} A_{m,n}^* \exp\left[\frac{2\pi i(m-m')x}{\Lambda_x} + \frac{2\pi i(n-n')y}{\Lambda_y}\right], \quad (2)$$

where the asterisk denotes a complex conjugation operation. The difference indices (m−m') and (n−n') can be graphically understood as the distance between the dots in FIG. 3B. As described more fully below, the Fourier representation of the intensity of the E field, i.e., the modulus squared of the field for a Hartmann mask, presents a complicated structure. Even the first order term corresponding (m−m', n−n')=(1,0) has an infinite sum of other harmonics. One of these sets can be {(m=1, n=0), (m'=0, n'=0)} or {(m=2, n=−3), (m'=1, n'=−3)}, etc.

Figure 4A:
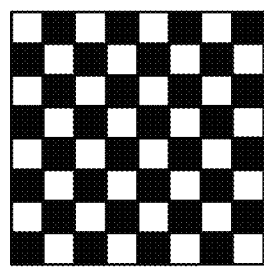
FIG. 4A is a diagram illustrating checkerboard pattern transmission mask.
Figure 4B:
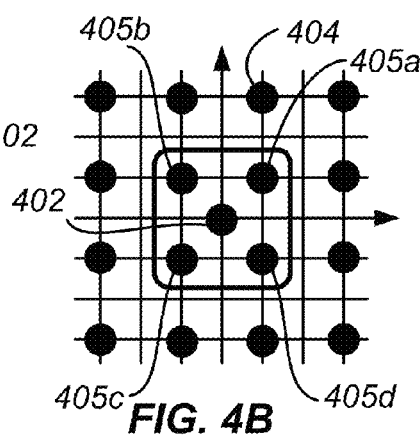
FIG. 4B is a frequency domain amplitude plot of the amplitude associated with the Checkerboard pattern transmission mask illustrated in FIG. 4A.
Figure 4C:
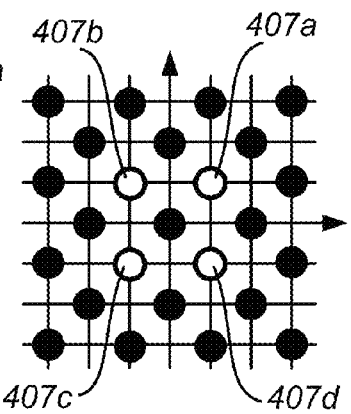
FIG. 4C is a frequency domain plot of intensity associated with the Checkerboard pattern transmission mask illustrated in FIG. 4A.

As described herein, embodiments of the present invention extract the wavefront based on orthogonal harmonics in the frequency domain, i.e., the open or white dots 407a, 407b, 407c, and 407d in FIG. 4C nearest the origin, for example, located at an angle (e.g., 45 degrees) from the x and y axes. The use of a polynomial fit to the recovered wavefront slopes only provides a relatively low resolution wavefront map. In some conventional methods, the harmonics used in the Fourier analysis methods is only a first order approximation. This approximation prevents further improvement in the spatial resolution of the wavefront being reconstructed.

Figure 1:
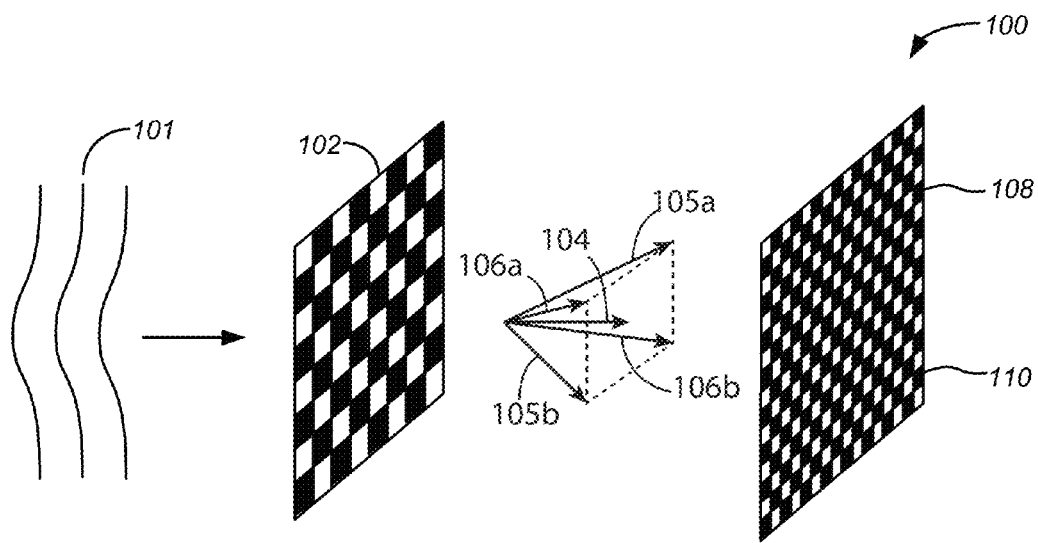
FIG. 1 is a perspective diagram illustrating elements of a wavefront sensing system according to an embodiment of the present invention.

FIG. 1 is a perspective diagram illustrating elements of a wavefront sensing system according to an embodiment of the present invention. Referring to FIG. 1, the wavefront sensor 100 provided by embodiments of the present invention includes a number of elements. Incident wavefront 101, with a generally non-planar phase front, is represented by wavy lines as appropriate to a non-planar wavefront. The wavefront 101 passes through and is diffracted by amplitude-only checkerboard pattern transmission mask 102 into a zero-order (arrow 104) and four diagonal first-order terms (arrows 105a, 105b, 106a, and 106b) in the embodiment illustrated in FIG. 1, which can be considered as four edges of a pyramid. The first-order terms, also referred to as first-order diffracted orders, are illustrated in FIG. 1 by two arrows lying on the diagonal edges (arrows 105a and 105b) and two arrows lying on the anti-diagonal edges (arrows 106a and 106b). Thus, two dimensional diffraction is illustrated in FIG. 1.

In some implementations, the checkerboard pattern mask is an amplitude-only mask, fabricated, for example, by patterning a chrome layer deposited on a fused silica or other suitable substrate. In these implementations, the phase impact of the light passing through the substrate on which the pattern is formed is negligible. The higher-order diffraction terms are not shown in FIG. 1 for purposes of clarity. The diffracted zero-order beam 104 and the diffracted first-order beams 105a/105b and 106a/106b interfere together at a predetermined distance from the mask 102 and form interferogram 108 at a detector plane 110 of an imaging device 112, which can correspond to the imaging plane of a detector, such as a charge-coupled-device (CCD) camera.

Figure 2:
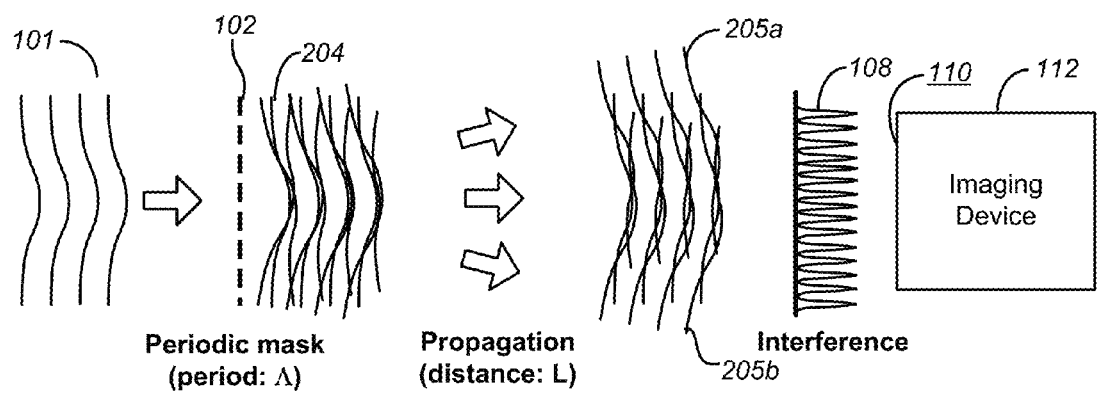
FIG. 2 is a side-view of elements of a wavefront sensing system according to an embodiment of the present invention.

FIG. 2 is a side-view of elements of a wavefront sensing system according to an embodiment of the present invention. The wavefront sensing system illustrated in FIG. 2 corresponds to the wavefront sensing system illustrated in FIG. 1, but presented in one dimension. It will be appreciated that an analogous diagram could be prepared the for the orthogonal direction. As discussed above, for purposes of clarity in FIGS. 1 and 2, the optical operation of the wavefront sensor is illustrated only considering the zero-order and first-order diffraction terms (two diffracted orders in each of the x and y directions). The diffraction of the wavefront 101 through the checkerboard mask 102 can be considered (in one dimension) as propagation of the zero-order diffracted beam 204 and two first-order (205a and 205b) diffracted beams. The zero-order beam 204 propagates in the same direction as the incident beam. These diffracted beams (204/205a/205b) correspond to the diffracted orders (104/105a/105b) discussed in relation to FIG. 1.

The first-order beams 205a and 205b propagate at an angle with respect to the zero-order term. Immediately after the amplitude-only checkerboard mask 102, the three fields are overlapped. At a distance L away, they separate from each other because they are propagating in different directions. These laterally separated beams propagating at an angle with respect to each other, interfere together to form an interferogram 108 at the detector plane 110 of the imaging device 112, at which a CCD or other suitable detector can be placed. The 1-D picture of the interferogram illustrated in FIG. 2 can be analogously represented by an FM radio signal in two dimensions in which the modulation frequency is varied locally. In other words, the interference pattern is a result of the local frequency that is modulated as a function of the features of the incoming wavefront. As described herein, embodiments of the present invention analyze the local frequency shift in two dimensions to extract the phase information associated with the incoming wavefront 101.

FIG. 3A is diagram illustrating a Hartmann mask featuring square/rectangular apertures arrayed on a dark background. Round apertures can be used as well. In some implementations, this mask is referred to as a Shack-Hartmann mask. FIG. 3B is a frequency domain plot of the intensity associated with the Hartmann mask 302 illustrated in FIG. 3A. As illustrated in FIG. 3B, the distribution of diffracted field or harmonics 301 in the frequency domain is periodic in the spatial frequency domain as appropriate to the Hartmann (or Shack-Hartmann) mask illustrated in FIG. 3A. A Fourier transform of the Hartmann mask illustrated in FIG. 3A produces the harmonics existing at the frequencies illustrated in FIG. 3B.

FIG. 4A is a diagram illustrating checkerboard pattern transmission mask. As illustrated in FIG. 4A, an amplitude-only transmission mask is utilized as an element of the wavefront sensor in some embodiments.

FIG. 4B is a frequency domain amplitude plot (i.e., related to the electric field) associated with the Checkerboard pattern transmission mask illustrated in FIG. 4A. In the frequency domain, the Fourier transform of the amplitude only transmission mask produces amplitude peaks 404 at frequency values associated with the periodicity of the mask. In particular, the harmonics 405a and 405b are the harmonics closest to the origin 402.

As illustrated in FIG. 4B in comparison with FIG. 3B, the checkerboard pattern mask has fewer spatial frequency components in the spatial frequency domain than those associated with the Hartmann mask. Accordingly, as illustrated in FIG. 4B, in the frequency domain, a number of the multiples of the fundamental frequency components are missing in the frequency domain, providing a sparser frequency domain plot.

FIG. 4C is a frequency domain plot of intensity associated with the Checkerboard pattern transmission mask illustrated in FIG. 4A. Because the intensity is proportional to the square of the amplitude (e.g. the modulus squared), the intensity distribution is periodic, similar to the frequency domain amplitude plot in FIG. 4B. In FIG. 4C, the harmonics at 407a, 407b, 407c, and 407d are highlighted by an open circle. The difference in shading in this figure is merely used to represent that harmonics 407a-407d are of particular interest for analysis. In particular, to generate the harmonic 407a, only three values are needed, greatly simplifying the analysis: the origin 402, the harmonic 405a in the first quadrant closest to the origin, and the harmonic 405c in the third quadrant closest to the origin. Likewise, to generate the harmonic 407b, only three values are needed: the origin 402, the harmonic 405b in the first quadrant closest to the origin, and the harmonic 405d in the third quadrant closest to the origin.

As discussed above, T(x, y) is the transmission function of a periodic mask and $\Lambda_x$, $\Lambda_y$ are periods in x and y directions. A two dimensional periodic structure can be uniquely represented by its Fourier coefficients $c_{m,n}$ as expressed in Eq. (1). Contrary to the dense distribution of the Fourier coefficients (301, as shown in FIG. 3B) for a conventional Hartmann mask (302 as shown in FIG. 3A) or for a conventional Shack-Hartmann lenslet array, the Fourier coefficients, $c_{m,n}$ 404, belonging to an amplitude-only checkerboard pattern 102 as shown in FIG. 4A, are all zeros at even indices except at (0,0). Non-zero terms are shown as frequency domain amplitude peaks 404 in FIG. 4B.

With further reference to Eq. (2) above, the difference indices (m−m') and (n−n') can be graphically understood as the distance between the peaks 404 in FIG. 4B and dots 301 in FIG. 3B. For an amplitude-only checkerboard mask 102, the difference indices have non-zero terms only at (m−m', n−n')= {(0,0), (1,1), (1,−1), (−1,1), (−1,−1), (2,0), (2,2), (0,2), (−2,2), (−2,0), (−2,−2), (0,−2), ... }. The locations of the non-zero terms are shown in FIG. 4C. The (m−m', n−n')=(0,0) term comes from multitudes of sets such as {(m=0, n=0), (m'=0, n'=0)} or {(m=1, n=−2), (m'=1, n'=−2)}. There are an infinite number of sets contributing to the (m−m', n−n')=(0,0) term, but in practice the actual number of terms are limited due to physical optics.

On the other hand, the term corresponding to (m−m', n−n')=(1,1) comes from only two terms, that is, {(m=1, n=1), (m'=0, n'=0)} and {(m=0, n=0), (m'=−1, n'=−1)}. This corresponds to the peak 407a in the first quadrant of FIG. 4C. Likewise, the other peaks 407b, 407, and 407d correspond to (m−m', n−n')=(−1,1) or (−1,−1) or (1,−1) and all these terms involve the sum of only two terms each. The other higher-order terms involve more than two terms. The Fourier representation of the intensity of the field, that is, the modulus squared of the field for a Hartmann mask has no such simple structure. Even the first-order term corresponding (m−m', n−n')=(1,0) has an infinite sum of other harmonics. One of these sets can be {(m=1, n=0), (m'=0, n'=0)} or {(m=2, n=−3), (m'=1, n'=−3)}, etc. The simplicity in the number of fields interacting in the diagonal terms of intensity measured through the amplitude-only checkerboard mask (peaks 407a-407d in FIG. 4C provides the benefits and advantages enabled by the present invention.

The Fourier transform of the measured interferogram has peaks in locations as shown in FIG. 4C. As described more fully below, embodiments of the present invention utilize the diagonal terms (peaks 407a-407d in FIG. 4C). The intensity (i.e., the magnitude squared) of the incident field is $$I = \frac{1}{4}(|H_{1,1}| + |H_{-1,1}| + |H_{1,-1}| + |H_{-1,-1}|) \quad (3)$$

The phase of these terms after inverse Fourier transformation have phase difference information of the incident wavefront in x- and y-directions. They can be expressed as $$\frac{\partial}{\partial x}\varphi = \frac{\Lambda_x}{4\lambda L}(\arg H_{1,1} - \arg H_{-1,1} + \arg H_{1,-1} - \arg H_{-1,-1}) \quad (4)$$

$$\frac{\partial}{\partial y}\varphi = \frac{\Lambda_y}{4\lambda L}(\arg H_{1,1} + \arg H_{-1,1} - \arg H_{1,-1} - \arg H_{-1,-1}),$$

where φ is the incident phase front in units of radians and 'arg' denotes the operation of taking phase of a complex number. H(±1, ±1) are the inverse Fourier transformed diagonal terms as shown by peaks 407a-407d FIG. 4C. The phase can be reconstructed by integrating the derivatives in Eq. (4) as described more fully below. The process described so far cannot resolve the wavefront map beyond the spatial resolution limit of shear $$\left(\frac{\lambda L}{\Lambda}\right)$$

imposed by conventional lateral shearing interferometry schemes.

Some embodiments of the present invention improve the wavefront resolution by point-by-point optimization as follows:

As described in regard to FIGS. 4A-4C, each diagonal term of the amplitude-only checkerboard mask interferogram is made of the sum of only two terms:

$$H(1,1) \sim E(1,1)E(0,0)^* + E(0,0)E(-1,-1)^*$$

$$H(-1,1) \sim E(-1,1)E(0,0)^* + E(0,0)E(1,-1)^*$$

$$H(-1,-1) \sim E(-1,-1)E(0,0)^* + E(0,0)E(1,1)^*$$

$$H(1,-1) \sim E(1,-1)E(0,0)^* + E(0,0)E(-1,1)^*. \quad (5)$$

where E(n,m) represents electric field harmonics shown in FIG. 4B (405a~d) and the asterisk denotes complex-conjugation operation.

As these harmonic terms are theoretically functions of the amplitude and phase of the incident electromagnetic field, a direct comparison between the measured harmonics and the estimated harmonics can be made. More specifically, one can optimize point-by-point values of amplitude and phase by minimizing the error metric defined as $$\min_{\phi,A} \iint |\Sigma_{m=\pm 1, n=\pm 1}| H_{m,n}^{estimated}(A,\phi) - H_{m,n}^{measured}|^2 dxdy. \quad (6)$$

The starting value of the amplitude and phase maps are given by the first step reduction [Eqs. (3-4)]. The point-by-point optimization proceeds from the low-resolution wavefront map obtained from the first step to the estimation of a higher resolution map by directly matching the more exact mathematical expression of the given measured quantity. In practice, only non-diagonally paired harmonics are used because arg $H_{1,1}$=−arg $H_{-1,-1}$, and arg $H_{-1,1}$=−arg $H_{1,-1}$ from the Fourier transform theorem of a real function. Therefore the number of harmonics to be handled is reduced from four to two in some embodiments by this simplification. The point-by-point optimization process utilized herein provides a higher resolution phase map than the first-order zonal method represented by Eq. (4) and other modal phase reconstruction methods.

Figure 5A:
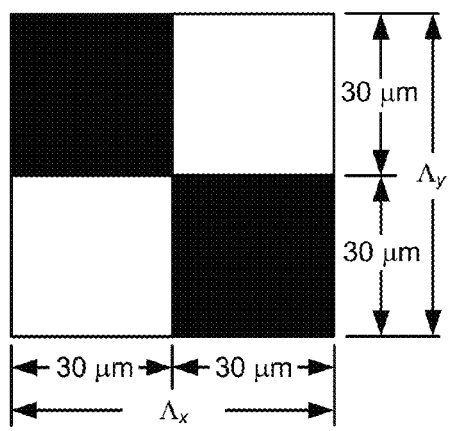
FIG. 5A is a diagram illustrating a unit cell of the checkerboard pattern transmission mask illustrated in FIG. 4A.

FIG. 5A is a diagram illustrating a unit cell of the checkerboard pattern transmission mask illustrated in FIG. 4A. As illustrated in FIG. 5A, an amplitude-only checkerboard transmission pattern mask can be manufactured by etching a chrome layer on a 19.1 mm diameter fused-silica substrate. As will be evident to one of skill in the art, other low transmission layers on other substrates can be utilized as appropriate to the particular implementation. The dimension of the unit cell as shown in FIG. 5A is 60 μm square (i.e., $\Lambda_x=\Lambda_y=\Lambda=60$ μm), although other dimensions can be utilized, for example, up to about 10 times larger than the pixel size of the detector used to detect the interferogram. Additionally, unit cells utilizing rectangular (i.e., $\Lambda_x$ and $\Lambda_y$), circular, and other shapes are included within the scope of the present invention. In one embodiment, the patterned mask was mounted directly in front of a 12-bit CCD camera.

Figure 5B:
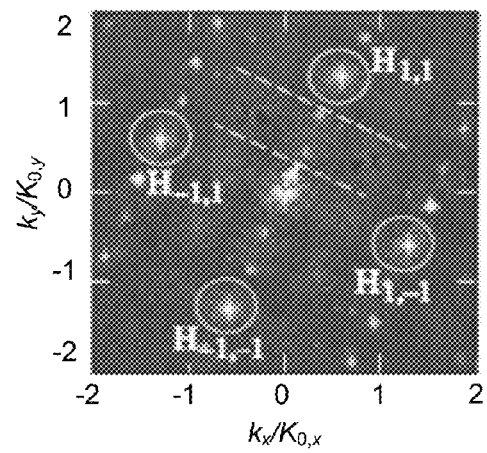
FIG. 5B is a frequency domain plot of associated with a measured interferogram associated with the rotated checkerboard pattern transmission mask illustrated in FIG. 4A.

FIG. 5B is a frequency domain plot associated with a measured interferogram associated with the rotated checkerboard pattern transmission mask illustrated in FIG. 4A/FIG. 5A. The interferogram 108 obtained using the checkerboard pattern transmission mask was Fourier transformed and the interferogram in the Fourier domain, also referred to as a frequency domain interferogram, is shown in FIG. 5B. As will be noted, the mask was rotated with respect to the CCD axes during the measurement, resulting in the peaks in the measurement not aligning with the x and y axes. Referring to FIGS. 4C and 5B, harmonic 407a corresponds to $H_{1,1}$, harmonic 407b corresponds to $H_{-1,1}$, harmonic 407c corresponds to $H_{-1,-1}$, and harmonic 407d corresponds to $H_{1,-1}$.

In FIG. 5B, the spatial-frequency axes are divided by unit frequency $K_{0,x[y]}=2\pi/\Lambda_{x[y]}$. The scale is compressed to bring out details of sidelobe wing structures. Using embodiments of the present invention, it is unnecessary to carefully align the mask parallel to the CCD axes since the rotation angle can be calculated by, for example, the centroid of the $H_{1,1}$. The slopes are then rotated into the CCD axes using the angle as described in relation to FIG. 8. During operation, spots appearing at unexpected locations can be attributed to secondary reflections in the system.

As described more fully below, the frequency of the harmonics, for example, harmonic $H_{1,1}$ will be a function of the carrier frequency of the mask and a small change in frequency resulting from non-uniform phase in the incident wavefront. For a wavefront with a uniform phase front, each of the harmonics $H_{1,1}$, $H_{-1,1}$, $H_{-1,-1}$, and $H_{1,-1}$ would be represented by a frequency profile similar to a sync function, an Airy function, or the like depending on the spatial shape and finite extent of the incident wavefront. As the wavefront varies from a uniform phase front, the frequency content of the harmonics will be blurred as a result of the local modulation. The measurement and analysis of this blurring is then used to determine the characteristics of the incident wavefront.

The Fourier-domain interferogram in FIG. 5B shows faint dark lines between the sidelobes. Two dashed white lines are overlaid on these lines to aid in their identification. These lines are caused by the destructive interference at the quarter-Talbot distance, referred to herein as Talbot lines. In some embodiments, it is advantageous to set the distance L between the mask and the detector optically downstream of the mask so that the number of the Talbot lines are minimized and their location is centered between the origin and the $H_{\pm 1,\pm 1}$ peaks to maximize spatial bandwidth. In the data shown in FIG. 5B, there are two Talbot lines. The distance from the origin to the nearest Talbot line can be computed as $K_L=\pi\Lambda/(2)^{1/2}\lambda L$. L can be roughly estimated using $K_L$ or can be more precisely determined by using a known wavefront-calibration source.

The inventors have determined that positioning of the detector with respect to the mask at a distance $$L = \frac{\Lambda^2}{8\lambda}, \frac{\Lambda^2}{4\lambda}, \frac{3\Lambda^2}{4\lambda}, \frac{5\Lambda^2}{4\lambda} \ldots$$

results in destructive interference between the first and zeroth order diffracted beams. As a result, the fringe visibility is very low at these distances. Accordingly, in order to improve performance, $\Lambda^2/8\lambda$ or the odd-integer multiples of $\Lambda^2/4\lambda$ can be avoided by positioning the mask and detector such that the distance between them is in accordance with $$0 < L < \frac{1}{8}\frac{\Lambda^2}{\lambda} \text{ or } \frac{1}{4}\frac{\Lambda^2}{\lambda}(2n-1) < L < \frac{1}{4}\frac{\Lambda^2}{\lambda}(2n+1),$$

where $\lambda$ is the wavelength of the incident field and n is a positive integer (1, 2, 3, ... ). In some embodiments, L is set at a distance that is in a range of values between the distances at which destructive interference occurs. One of ordinary skill in the art would recognize many variations, modifications, and alternatives.

As will be evident to one of skill in the art, L is not fixed for a given wavelength, but can be defined by a range. A fixed L can be utilized for broad range of wavelengths with L satisfying the inequality conditions, or in other words, L is a predetermined distance away from the distances associated with destructive interference.

As an example, for incident light in the wavelength range from 10 nm to 2,000 nm, including soft-x-ray, ultraviolet, visible, and near-infrared spectra, L is typically in the range of 1 mm≤L≤10 mm. Although some embodiments are described in relation to optical wavelengths, embodiments of the present invention are not limited to optical applications and other wavelength regions, including microwave, are included within the scope of the present invention.

Figure 6A:
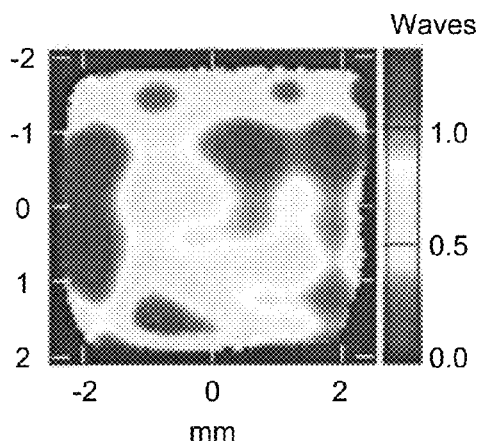
FIG. 6A is a plot illustrating a wavefront measurement made using an embodiment of the present invention.
Figure 6B:
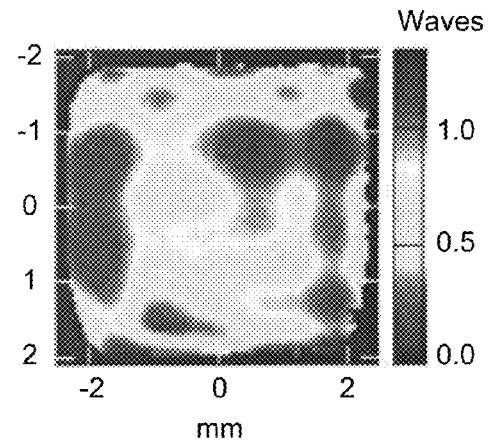
FIG. 6B is a plot illustrating a wavefront measurement made using a conventional Shack-Hartmann sensor.
Figure 6C:
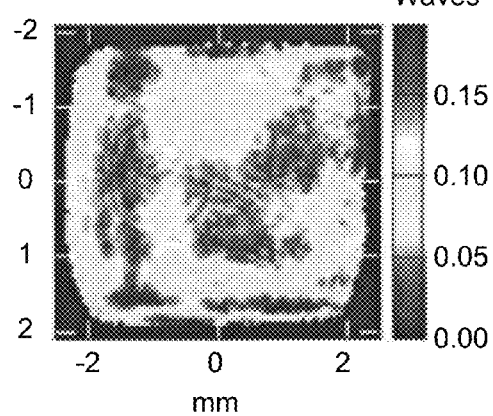
FIG. 6C is a plot illustrating the difference between the plots in FIGS. 6A and 6B.

FIG. 6A is a plot illustrating a wavefront measurement made using an embodiment of the present invention. FIG. 6B is a plot illustrating a wavefront measurement made using a conventional Shack-Hartmann sensor. FIG. 6C is a plot illustrating the difference between the plots in FIGS. 6A and 6B. Referring to FIGS. 6A and 6B, a random wavefront was generated by a spatial-light modulator and reconstructed wavefronts were measured using an embodiment of the present invention (FIG. 6A) and using a Shack-Hartmann sensor (FIG. 6B). As illustrated in FIG. 6C, the difference in the phase fronts between the two wavefront maps is 0.19 waves in peak-to-valley and 0.03 waves in root mean square (rms) at 1.053 μm wavelength, which demonstrates that embodiments of the present invention provide performance comparable to Shack-Hartmann sensors.

Figure 7:
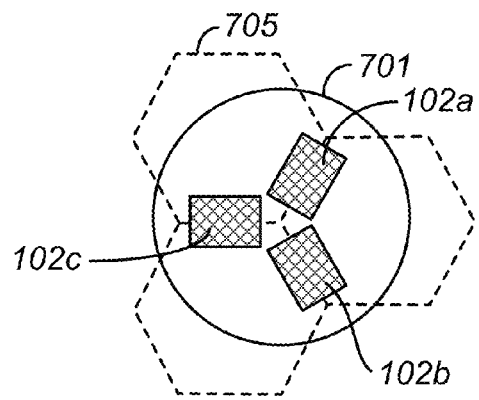
FIG. 7 is a diagram illustrating the use of an embodiment of the present invention in aligning hexagonally segmented mirrors according to an embodiment of the present invention.

FIG. 7 is a diagram illustrating the use of an embodiment of the present invention in aligning hexagonally segmented mirrors according to an embodiment of the present invention. Hexagonally segmented mirrors are often used in large astronomical telescopes. Three regions of the checkerboard transmission mask are printed on a single substrate. The orientation and the location of these regions are designed such that they overlap the boundaries or seams of the hexagonal mirror segments in the image of the hexagonal mirrors. Referring to FIG. 7, a mask 701 could include (three) amplitude-only checkerboard patterns 102a, 102b, and 102c oriented in different directions on a single plate. The dotted hexagons 705 represent segmented hexagonal spherical mirrors. In general, the wavefront reflected from these segmented surfaces is not continuous due to piston differences between the hexagonal segments. The interference from each pattern could be used to co-phase the three mirrors. One of ordinary skill in the art would recognize many variations, modifications, and alternatives.

Figure 8:
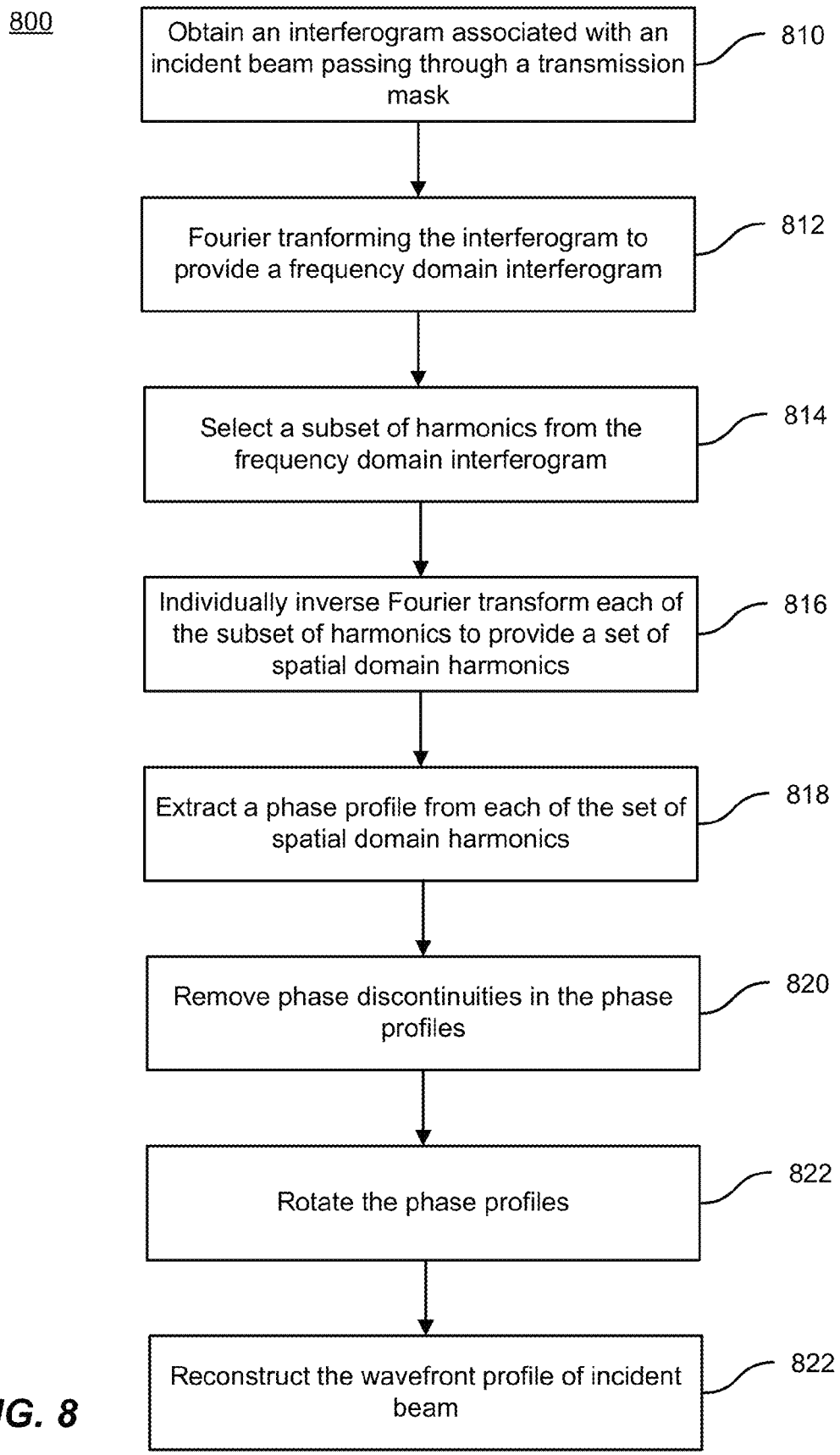
FIG. 8 is a method of measuring a wavefront according to an embodiment of the present invention.

FIG. 8 is a method of measuring a wavefront according to an embodiment of the present invention. As described below, the method can be used to compute a phase front profile of an incident beam. The method 800 includes obtaining an interferogram associated with an incident beam, characterized by a wavefront, passing through a transmission mask (810). The transmission mask can be a checkerboard pattern transmission mask, for example, an amplitude-only transmission mask. The interferogram can be represented by the intensity proportional to the value computed in Eq. (2).

An exemplary interferogram is illustrated as interferogram 108 in FIGS. 1 and 2. The method also includes Fourier transforming the interferogram to provide a frequency domain interferogram (812). Referring to FIG. 5B, the frequency domain plot associated with a measured interferogram associated with the Checkerboard pattern transmission mask is an exemplary frequency domain interferogram.

As illustrated in FIG. 5B, the frequency domain interferogram includes a number of harmonics. The method includes selecting a subset of harmonics from the frequency domain interferogram (814) and individually inverse Fourier transforming each of the subset of harmonics to provide a set of spatial domain harmonics (816). During the selection process, the subset of harmonics can be cropped to remove contributions from higher order harmonics and to reduce the number of samples for faster processing. Referring to FIG. 5B, the harmonics $H_{1,1}$, $H_{-1,1}$, $H_{-1,-1}$, and $H_{1,-1}$ are circled to illustrate cropping of the harmonics in the frequency domain. In an embodiment, the subset of harmonics includes the harmonics closest to the origin in each quadrant (e.g., $H_{1,1}$, $H_{-1,1}$, $H_{-1,1}$, and $H_{1,-1}$). In another embodiment, the subset of harmonics consists of the harmonics closest to the origin in two adjacent quadrants (either $H_{1,1}$ and $H_{-1,1}$ or $H_{-1,1}$ and $H_{1,-1}$). In some embodiments, the frequency domain interferogram is represented by a matrix and smaller matrices centered on the harmonics are utilized to perform the cropping function. One of ordinary skill in the art would recognize many variations, modifications, and alternatives.

After selection and cropping of the harmonics, a down-sampled set of harmonics is available for use in performing the inverse Fourier transform. As will be evident to one of skill in the art, the centering of the harmonics during the cropping process removes the carrier frequency, resulting in spatial domain down-sampled harmonics, referred to as spatial domain harmonics, as a result of the inverse Fourier transform. The result can be considered as an array of complex values related to the amplitude and phase of the incident wavefront.

Figure 10A:
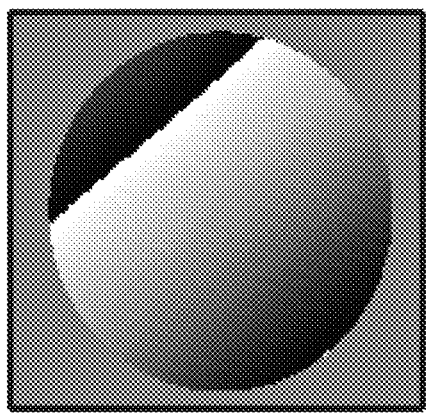
FIG. 10A is a plot illustrating a phase profile for a first harmonic according to an embodiment of the present invention.
Figure 10B:
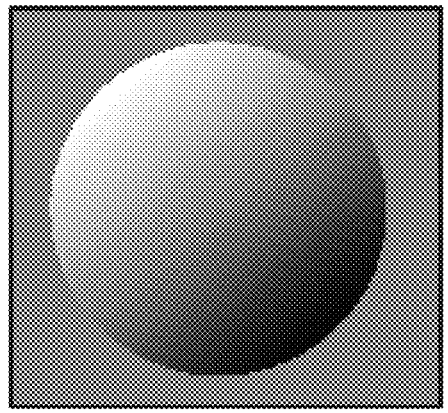
FIG. 10B is a plot illustrating an unwrapped phase profile for the first harmonic according to an embodiment of the present invention.
Figure 10C:
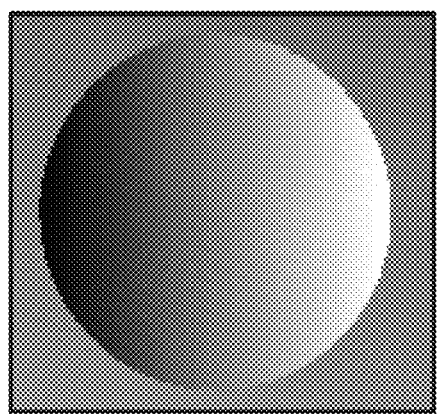
FIG. 10C is a plot illustrating a rotated phase profile for the first harmonic according to an embodiment of the present invention.

The method further includes extracting a phase profile from each of the set of spatial domain harmonics (818). For each harmonic, the phase profile will represent a linear combination of the slopes of the phase in the x and y-directions as discussed in relation to Eq. (4), more particularly, the inversion of Eq. (4). FIG. 10A is a plot illustrating a wrapped phase profile for a first harmonic according to an embodiment of the present invention. FIG. 10B is a plot illustrating an unwrapped phase profile for the first harmonic according to an embodiment of the present invention. FIG. 10C is a plot illustrating a rotated phase profile for the first harmonic according to an embodiment of the present invention.

As illustrated in FIG. 10A, the slope of the phase of harmonic $H_{1,1}$ is illustrated in the x-direction and the y-direction. For reference, refer to harmonic 407a in FIG. 4C and harmonic $H_{1,1}$ in FIG. 5B. The discontinuity (i.e., $2\pi$ shift) in the slope is illustrated by the transition between black and white in the top left half of the plot. The method includes removing phase discontinuities in the phase profile (820) and rotating the phase profile (822). Referring to FIG. 10B, the phase discontinuity in the top left portion of the plot has been removed during the unwrapping process so that the phase profile is continuous over the plot. By removing these phase discontinuities, embodiments of the present invention enable embodiments of the present invention to measure phase fronts characterized by large variation in phase across the wavefront, which contrasts with approaches that do not use the phase unwrapping process, which are unable to measure large variation phase fronts and are limited to small variations in the phase front.

FIG. 10C illustrate the special case of quadratic input wavefront. The phase profile, i.e., the slope of the input wavefront after rotation is in a single direction. As illustrated in FIG. 10C, the phase varies in the x-direction, but is constant in the y-direction for $H_{1,1}$. Similarly, in FIG. 11C, the phase varies in the y-direction, but is constant in the x-direction for $H_{-1,1}$. The rotation of the phase profile simplifies system alignment since rotation of the transmission mask with respect to the detector can be removed by the system.

Figure 11A:
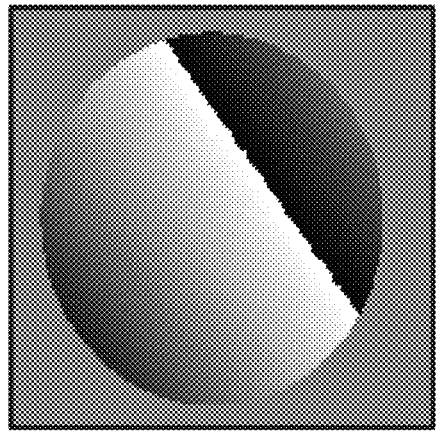
FIG. 11A is a plot illustrating a phase profile for a second harmonic according to an embodiment of the present invention.
Figure 11B:
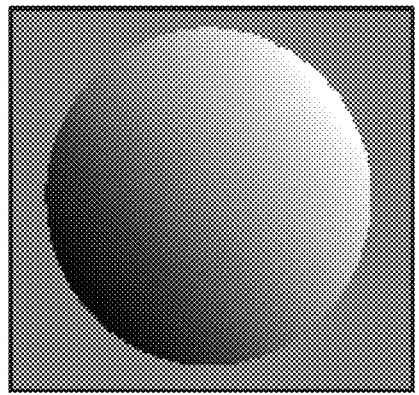
FIG. 11B is a plot illustrating an unwrapped phase profile for the second harmonic according to an embodiment of the present invention.
Figure 11C:
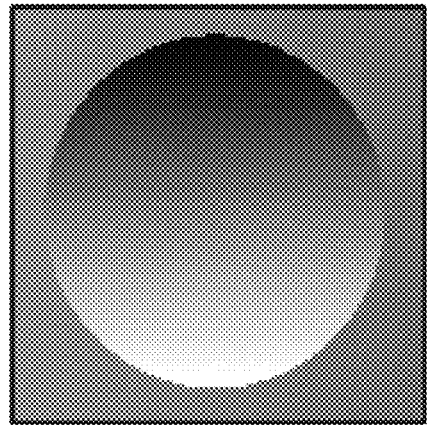
FIG. 11C is a plot illustrating a rotated phase profile for the second harmonic according to an embodiment of the present invention.

FIG. 11A is a plot illustrating a phase profile for a second harmonic according to an embodiment of the present invention. For reference, refer to harmonic 407b in FIG. 4C and harmonic $H_{-1,1}$ in FIG. 5B. FIG. 11B is a plot illustrating an unwrapped phase profile for the second harmonic according to an embodiment of the present invention. FIG. 11C is a plot illustrating a rotated phase profile for the second harmonic according to an embodiment of the present invention. In FIGS. 11A-11C, the harmonic used is the $H_{-1,1}$ harmonic. The phase discontinuity in the top right portion of FIG. 11A is removed by unwrapping the phase profile to provide the plot in FIG. 11B. The rotation of the phase profile results in the phase profile in FIG. 11C that only varies in the y-direction. It will be noted that the ramps in the phase profiles for $H_{1,1}$ and $H_{-1,1}$ are orthogonal to each other.

The quantities represented by FIGS. 10B and 11B are the wavefront slopes viewed from the checkerboard mask frame of reference and the quantities represented by FIGS. 10C and 11C are viewed from the detector frame of reference. The quantities represented by FIGS. 10C and 11C are the results of the linear transformation of the quantities represented by FIGS. 10B and 11B.

Using phase profiles of harmonics, the x and y derivatives of the incident beam phase front profile are calculated. From these derivatives, the phase front profile is reconstructed by integrating the rotated phase profiles (822). In embodiments, reconstructing the phase front profile includes performing a two-dimensional integration of the phase profiles associated with each of the set of spatial domain harmonics.

The method includes, in some embodiments, computing the intensity profile associated with the incident beam. In these embodiments, the method includes measuring an amplitude associated with the spatial domain harmonics and computing an intensity profile associated with incident beam. The amplitude associated with the spatial domain harmonics is computed based on the absolute value of the array of complex values and the intensity is a function of the square of the amplitude values for the harmonics as illustrated in Eq. (3). By providing the intensity profile of the incident wavefront, embodiments of the present invention provide data not typically available using conventional wavefront sensors, which only provide the low-resolution intensity profile and need an extra camera to provide high-resolution intensity data.

It should be appreciated that the specific steps illustrated in FIG. 8 provide a particular method of measuring a wavefront according to an embodiment of the present invention. Other sequences of steps may also be performed according to alternative embodiments. For example, alternative embodiments of the present invention may perform the steps outlined above in a different order. Moreover, the individual steps illustrated in FIG. 8 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 9:
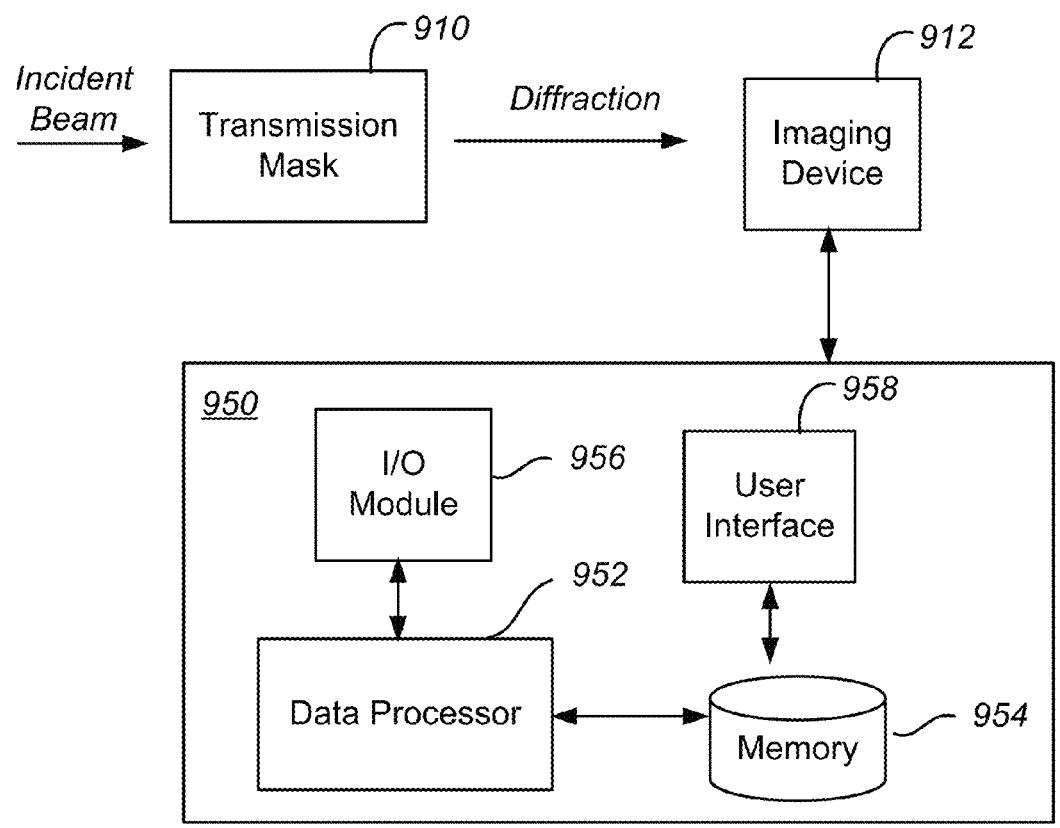
FIG. 9 is a schematic diagram illustrating a wavefront sensor according to an embodiment of the present invention.

FIG. 9 is a schematic diagram illustrating a wavefront sensor according to an embodiment of the present invention. The wavefront sensor includes a transmission mask 910 upon which an incident beam is incident. The incident beam is characterized by a wavefront defined by an intensity profile and a phase front profile. The incident beam is diffracted as it passes through the transmission mask 910 and impinges on an imaging device 912, such as a CCD camera. The interferogram produced by the light diffracting through the transmission mask is measured using the imaging device. The computer 950 receives the interferogram and computes the wavefront of the incident beam, including the phase front profile and/or the intensity profile.

The computer 950 includes a processor 952, also referred to as a data processor, a storage device 954, and an input/output device 956. The processor 952 represents a central processing unit of any type of architecture, such as a CISC (Complex Instruction Set Computing), RISC (Reduced Instruction Set Computing), VLIW (Very Long Instruction Word), or a hybrid architecture, although any appropriate processor may be used. The processor 952 executes instructions and includes that portion of the computer 950 that controls the operation of the entire computer. Although not depicted in FIG. 9, the processor 952 typically includes a control unit that organizes data and program storage in memory and transfers data and other information between the various parts of the computer 950. The processor 952 receives input data from the input/output module 956 and reads and stores code and data in the storage device 954 and presents data to the input/output module 956 and the user interface 958.

Although the computer 950 is shown to contain only a single processor 952, the disclosed embodiment applies equally to computers that may have multiple processors and to computers that may have multiple buses with some or all performing different functions in different ways.

The storage device 954 represents one or more mechanisms for storing data. For example, the storage device 954 may include cloud storage, read-only memory (ROM), random access memory (RAM), magnetic disk storage media, optical storage media, flash memory devices, and/or other machine-readable media. In other embodiments, any appropriate type of storage device may be used. Although only one storage device 954 is shown, multiple storage devices and multiple types of storage devices may be present. Further, although the computer 950 is drawn to contain the storage device 954, it may be distributed across other computers, for example on a server or otherwise in the cloud.

The storage device 954 includes a controller (not shown in FIG. 9) and data items. The controller includes instructions capable of being executed on the processor 952 to carry out the methods described more fully throughout the present specification, including Fourier transforms, inverse Fourier transforms, integration of the phase profiles, and the like. In another embodiment, some or all of the functions are carried out via hardware in lieu of a processor-based system. In one embodiment, the controller is a web browser, but in other embodiments the controller may be a database system, a file system, an electronic mail system, a media manager, an image manager, or may include any other functions capable of accessing data items. Of course, the storage device 954 may also contain additional software and data (not shown), which is not necessary to understand the invention.

The embodiments described herein may be implemented in an operating environment comprising software installed on any programmable device, in hardware, or in a combination of software and hardware. Although embodiments have been described with reference to specific example embodiments, it will be evident that various modifications and changes may be made to these embodiments without departing from the broader spirit and scope of the invention. Accordingly, the specification and drawings are to be regarded in an illustrative rather than a restrictive sense.

As may be used herein for purposes of the present disclosure, the term 'about' means the amount of the specified quantity plus/minus a fractional amount thereof that a person skilled in the art would recognize as typical and reasonable for that particular quantity or measurement; e.g., "wherein $\Lambda$ and $\Lambda_y$ are about 10 times larger than a pixel size of a detector used to detect the interferogram" could mean 'wherein $\Lambda_x=\Lambda_y$ is equal to about 60±8 μm for a 6.45 μm pixel CCD chip.' Likewise, the term 'substantially' means as close to or similar to the specified term being modified as a person skilled in the art would recognize as typical and reasonable; for e.g., within typical manufacturing and/or assembly tolerances, as opposed to being intentionally different by design and implementation.

It should be appreciated that all combinations of the foregoing concepts and additional concepts discussed herein (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of measuring characteristics of a wavefront of an incident beam having a phase front, the method comprising:
   providing a transmission mask;
   providing an imaging device having a detector plane;
   passing a portion of the incident beam through the transmission mask;
   propagating the portion of the incident beam passing through the transmission mask over a predetermined distance;
   forming an interferogram at the detector plane of the imaging device;
   detecting the interferogram using the imaging device;
   Fourier transforming the interferogram to provide a frequency domain interferogram;
   selecting a subset of harmonics from the frequency domain interferogram;
   individually inverse Fourier transforming each of the subset of harmonics to provide a set of spatial domain harmonics;
   extracting a phase profile from the set of spatial domain harmonics;
   removing phase discontinuities in the phase profile;
   rotating the phase profile; and
   reconstructing the phase front of the wavefront of the incident beam.

2. The method of claim 1 further comprising:
   measuring an amplitude associated with the spatial domain harmonics; and
   computing an intensity profile associated with the wavefront of the incident beam.

3. The method of claim 1 wherein the transmission mask comprises a checkerboard pattern transmission mask.

4. The method of claim 3 wherein the checkerboard pattern transmission mask comprises an amplitude-only transmission mask.

5. The method of claim 1 wherein the subset of harmonics comprises a harmonic closest to an origin in each quadrant.

6. The method of claim 5 wherein the subset of harmonics comprises four harmonics closest to the origin.

7. The method of claim 1 wherein the subset of harmonics comprises a harmonic closest to an origin in two adjacent quadrants.

8. The method of claim 7 wherein the subset of harmonics comprises four harmonics closest to the origin.

9. The method of claim 1 wherein the phase profile characterizes a slope of the phase front.

10. The method of claim 1 wherein reconstructing the phase front comprises performing a two dimensional integration of the phase profile associated with each of the set of spatial domain harmonics.

* * * * *